United States Patent
Wang

(10) Patent No.: US 11,515,196 B1
(45) Date of Patent: Nov. 29, 2022

(54) METHODS FOR ETCHING A SEMICONDUCTOR STRUCTURE AND FOR CONDITIONING A PROCESSING REACTOR

(71) Applicant: GlobalWafers Co., Ltd., Hsinchu (TW)

(72) Inventor: Gang Wang, Grover, MO (US)

(73) Assignee: GlobalWafers Co., Ltd., Hsinchu (TW)

( * ) Notice: Subject to any disclaimer, the term of this patent is extended or adjusted under 35 U.S.C. 154(b) by 0 days.

(21) Appl. No.: 17/319,888

(22) Filed: May 13, 2021

(51) Int. Cl.
| | |
|---|---|
| *H01L 21/687* | (2006.01) |
| *H01L 21/311* | (2006.01) |
| *H01J 37/32* | (2006.01) |
| *C23C 16/24* | (2006.01) |

(52) U.S. Cl.
CPC ........ *H01L 21/68757* (2013.01); *C23C 16/24* (2013.01); *H01J 37/32477* (2013.01); *H01J 37/32715* (2013.01); *H01L 21/311* (2013.01); *H01L 21/31116* (2013.01); *H01L 21/68735* (2013.01)

(58) Field of Classification Search
None
See application file for complete search history.

(56) References Cited

U.S. PATENT DOCUMENTS

| | | | |
|---|---|---|---|
| 5,198,071 A * | 3/1993 | Scudder | H01L 21/02532 148/DIG. 24 |
| 6,770,144 B2 | 8/2004 | Raffin et al. | |
| 2002/0020358 A1 | 2/2002 | Hey et al. | |
| 2002/0173164 A1* | 11/2002 | Raffin | C23C 16/4405 257/E21.279 |
| 2006/0032586 A1 | 2/2006 | Choi et al. | |
| 2016/0176707 A1 | 6/2016 | Montez et al. | |
| 2018/0282865 A1 | 10/2018 | Wang et al. | |
| 2019/0194803 A1* | 6/2019 | Kato | H01L 21/68764 |

FOREIGN PATENT DOCUMENTS

JP 2011233583 * 11/2011 ............. C01B 33/02

* cited by examiner

*Primary Examiner* — Jiong-Ping Lu
(74) *Attorney, Agent, or Firm* — Armstrong Teasdale LLP

(57) ABSTRACT

Methods for etching a semiconductor structure and for conditioning a processing reactor in which a single semiconductor structure is treated are disclosed. An engineered polycrystalline silicon surface layer is deposited on a susceptor which supports the semiconductor structure. The polycrystalline silicon surface layer may be engineered by controlling the temperature at which the layer is deposited, by grooving the polycrystalline silicon surface layer or by controlling the thickness of the polycrystalline silicon surface layer.

12 Claims, 7 Drawing Sheets

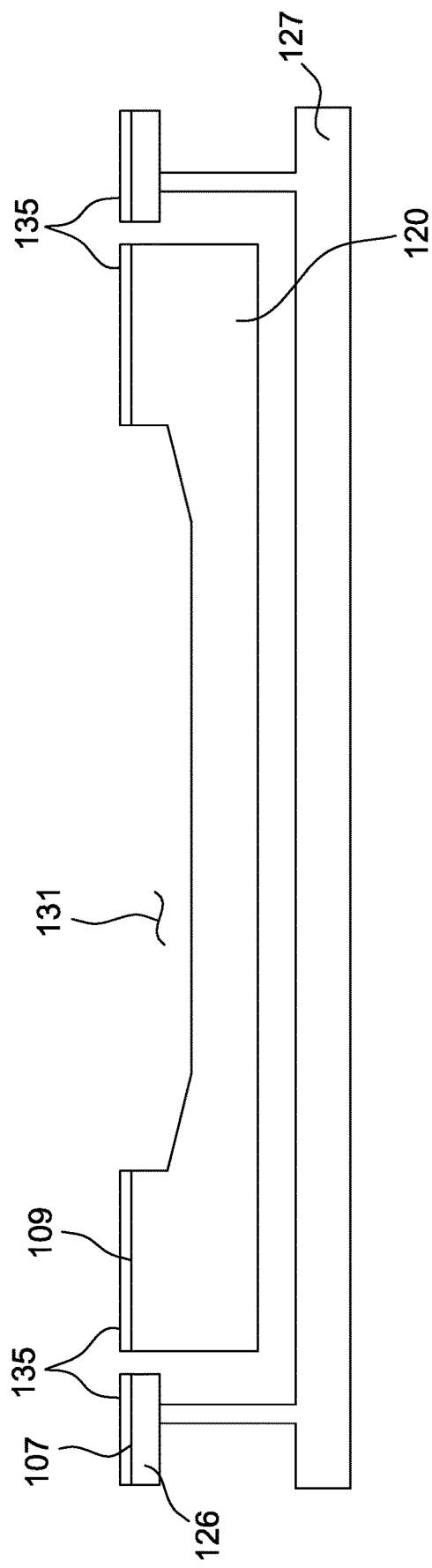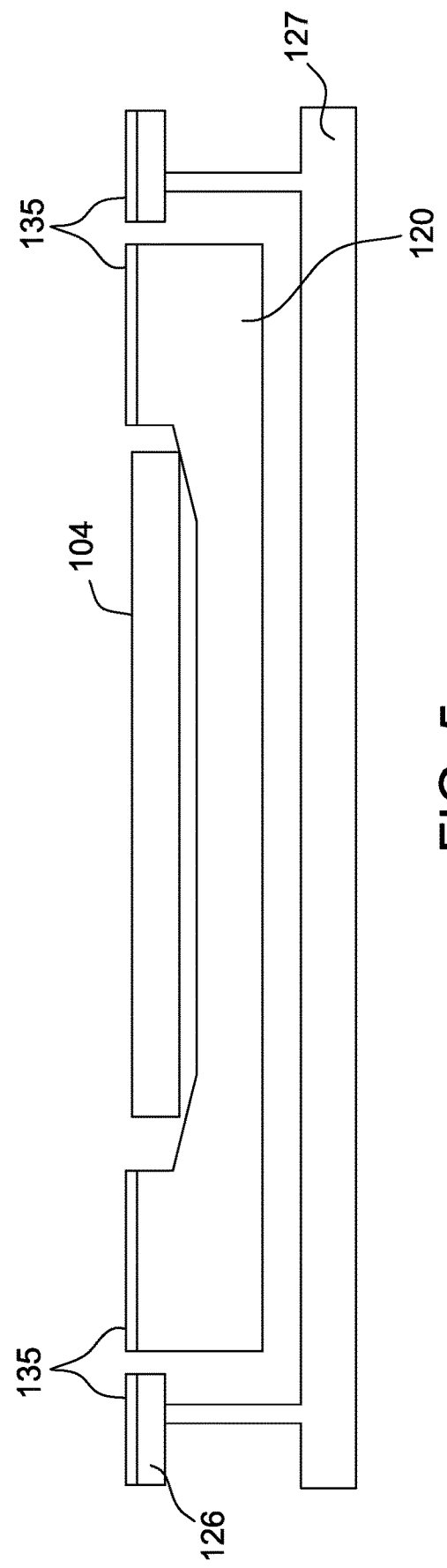

METHODS FOR ETCHING A SEMICONDUCTOR STRUCTURE AND FOR CONDITIONING A PROCESSING REACTOR

FIELD OF THE DISCLOSURE

The field of the disclosure relates to methods for etching a semiconductor structure and to methods for conditioning a reactor for treating a single semiconductor structure.

BACKGROUND

In a single-wafer thermal process chamber, a semiconductor structure is supported by a susceptor. In some instances, it is desirable to etch the top surface of the structure. For example, silicon-on-insulator structures may be smoothed by etching to achieve a top silicon layer thickness target and a surface roughness target. Such structures may undergo edge boundary effects in which the chemical processes toward the edge of the semiconductor structure become disrupted. Such effects may result from disruption in heat transfer, momentum transport, mass transport or combinations thereof. Edge boundary effect may cause edge roll-off to occur toward the edge of the semiconductor structure. There is increased demand for semiconductor structures with across-wafer uniformity in thickness and flatness, particularly in advanced (e.g., 10 nm technology and beyond) CMOS device fabrication.

Conventional methods for reducing the localized edge boundary effects are limited. For example, varying the pressure in the process chamber is limited by throughput and reactor configuration. The gap between the wafer edge and the susceptor is limited by manufacturing tolerances and thermal expansion. Increasing the height of the pocket in which the semiconductor structure sits in the susceptor extends the affected region toward the inner region of the semiconductor structure. Further, varying the gap and pocket depth does not improve azimuthal thickness uniformity which is determined by centering the semiconductor structure in the susceptor.

A need exists for methods for mitigating edge loading effects during etching of a semiconductor structure to improve thickness uniformity of the etched semiconductor structure.

This section is intended to introduce the reader to various aspects of art that may be related to various aspects of the disclosure, which are described and/or claimed below. This discussion is believed to be helpful in providing the reader with background information to facilitate a better understanding of the various aspects of the present disclosure. Accordingly, it should be understood that these statements are to be read in this light, and not as admissions of prior art.

SUMMARY

One aspect of the present disclosure is directed to a method for etching a semiconductor structure in a processing reactor. The processing reactor includes a susceptor which supports the semiconductor structure. A polycrystalline silicon surface layer is deposited on the susceptor. The polycrystalline silicon surface layer is contacted with a first etchant to produce a surface-modified polycrystalline silicon surface layer. A semiconductor structure is loaded onto the susceptor having the surface-modified polycrystalline silicon surface layer disposed thereon. The semiconductor structure is contacted with a second etchant to etch the semiconductor structure.

Another aspect of the present disclosure is directed to a method for etching a semiconductor structure in a processing reactor. The processing reactor includes a susceptor which supports the semiconductor structure. A polycrystalline silicon surface layer is deposited on the susceptor at a temperature of less than 1150° C. A semiconductor structure is loaded onto the susceptor having the polycrystalline silicon surface layer disposed thereon. The semiconductor structure is contacted with an etchant to etch the semiconductor structure.

A further aspect of the present disclosure is directed to a method for conditioning a processing reactor for treating a single semiconductor structure. The reactor includes a susceptor for supporting a semiconductor structure. A stripping etchant is introduced into the processing reactor without a semiconductor structure being disposed on the susceptor to strip a polycrystalline silicon surface layer from the susceptor. A polycrystalline silicon surface layer is deposited on the susceptor without a semiconductor structure being disposed on the susceptor. A grooving etchant is introduced into the processing reactor without a semiconductor structure being disposed on the susceptor. The grooving etchant contacts the polycrystalline silicon surface layer to produce a surface-modified polycrystalline silicon surface layer.

Yet another aspect of the present disclosure is directed to a method for conditioning a processing reactor for treating a single semiconductor structure. The reactor includes a susceptor for supporting a semiconductor structure. A stripping etchant is introduced into the processing reactor without a semiconductor structure being disposed on the susceptor to strip a polycrystalline silicon surface layer from the susceptor. A polycrystalline silicon surface layer is deposited on the susceptor without a semiconductor structure being disposed on the susceptor at a temperature of less than 1150° C.

Various refinements exist of the features noted in relation to the above-mentioned aspects of the present disclosure. Further features may also be incorporated in the above-mentioned aspects of the present disclosure as well. These refinements and additional features may exist individually or in any combination. For instance, various features discussed below in relation to any of the illustrated embodiments of the present disclosure may be incorporated into any of the above-described aspects of the present disclosure, alone or in any combination.

BRIEF DESCRIPTION OF THE DRAWINGS

FIG. 4 is a detailed cross-section view of the processing reactor showing a preheat ring and a susceptor with a polycrystalline silicon surface layer deposited on the preheat ring and the susceptor;

FIG. 5 is a detailed cross-section view of the processing reactor showing the preheat ring and the susceptor with a polycrystalline silicon surface layer deposited on the preheat ring and the susceptor with a semiconductor structure disposed on the susceptor;

Corresponding reference characters indicate corresponding parts throughout the drawings.

DETAILED DESCRIPTION

Provisions of the present disclosure relate to methods for conditioning a reactor for treating a single semiconductor structure (e.g., to etch or smooth the structure) and to methods for etching a semiconductor structure in a processing reactor. The processing reactor includes a susceptor on which an engineered polycrystalline silicon surface layer is applied.

Figure 1:
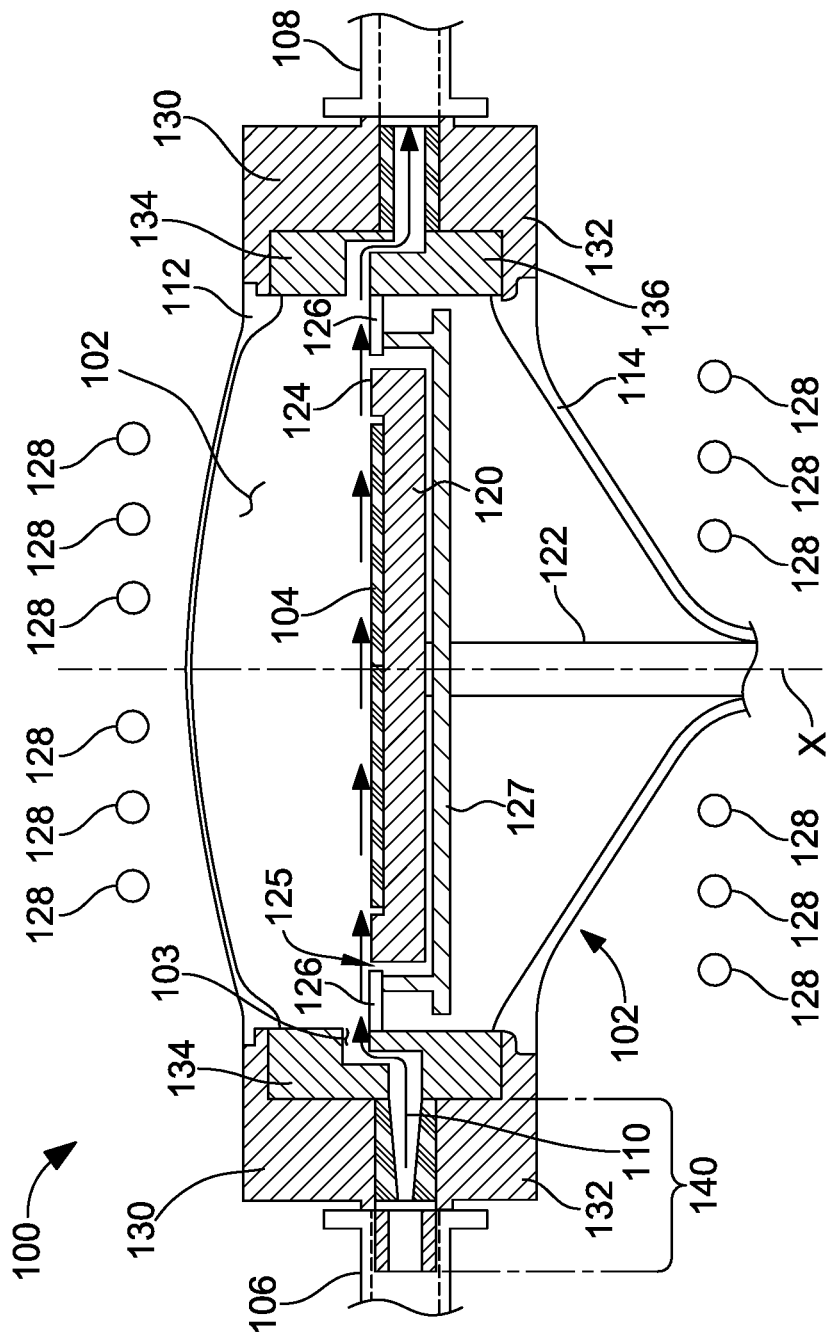
FIG. 1 is a cross-section view of a processing reactor for etching a semiconductor structure before loading a semiconductor structure into the reactor.
Figure 2:
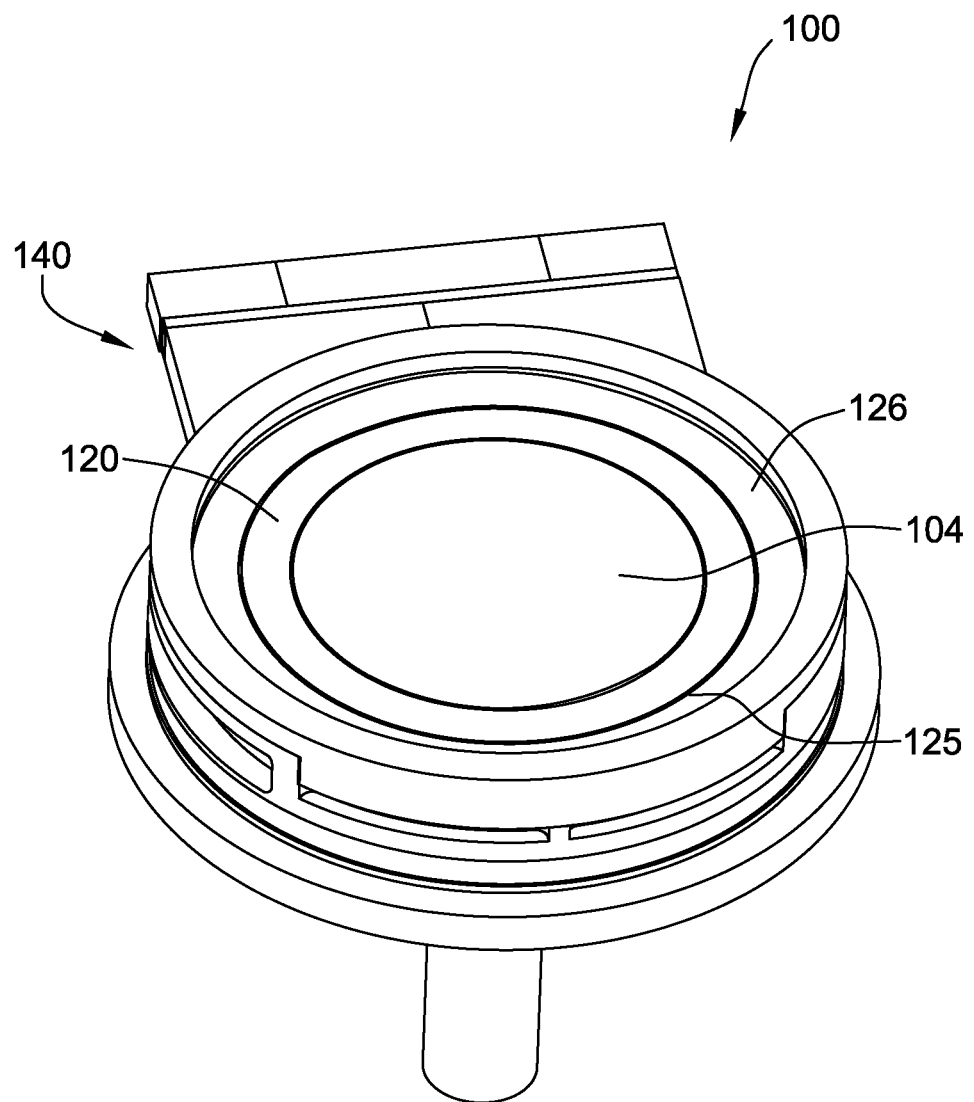
FIG. 2 is a perspective view of the processing reactor having a semiconductor structure loaded therein.

An example processing reactor 100 for use in accordance with embodiments of the present disclosure is shown in FIGS. 1-2. The illustrated reactor 100 is a single substrate (i.e., semiconductor structure) reactor in which a single substrate is loaded onto the reactor 100 during processing. The reactor 100 includes a processing chamber 102 in which a single semiconductor is etched. The reactor 100 may be suitable for other semiconductor structure processing such as CVD growth (i.e., epitaxial growth) of a thin film on the structure. The reactor 100 includes a gas injection port 106 disposed at one end of the processing chamber 102, and a gas discharge port 108 disposed at an opposite end of the processing chamber 102. A gas manifold 140 disposed between the gas injecting port 106 and the processing chamber 102 is used to direct incoming gas 110 into the processing chamber 102 enclosed by an upper window 112 and a lower window 114 through the gas injection port 106.

In operation, an incoming process gas 110 flows through the gas manifold 140 and into the processing chamber 102 through gas inlet 103. The gas 110 flows through the processing chamber 102 and is discharged through the gas discharge port 108.

Figure 3:
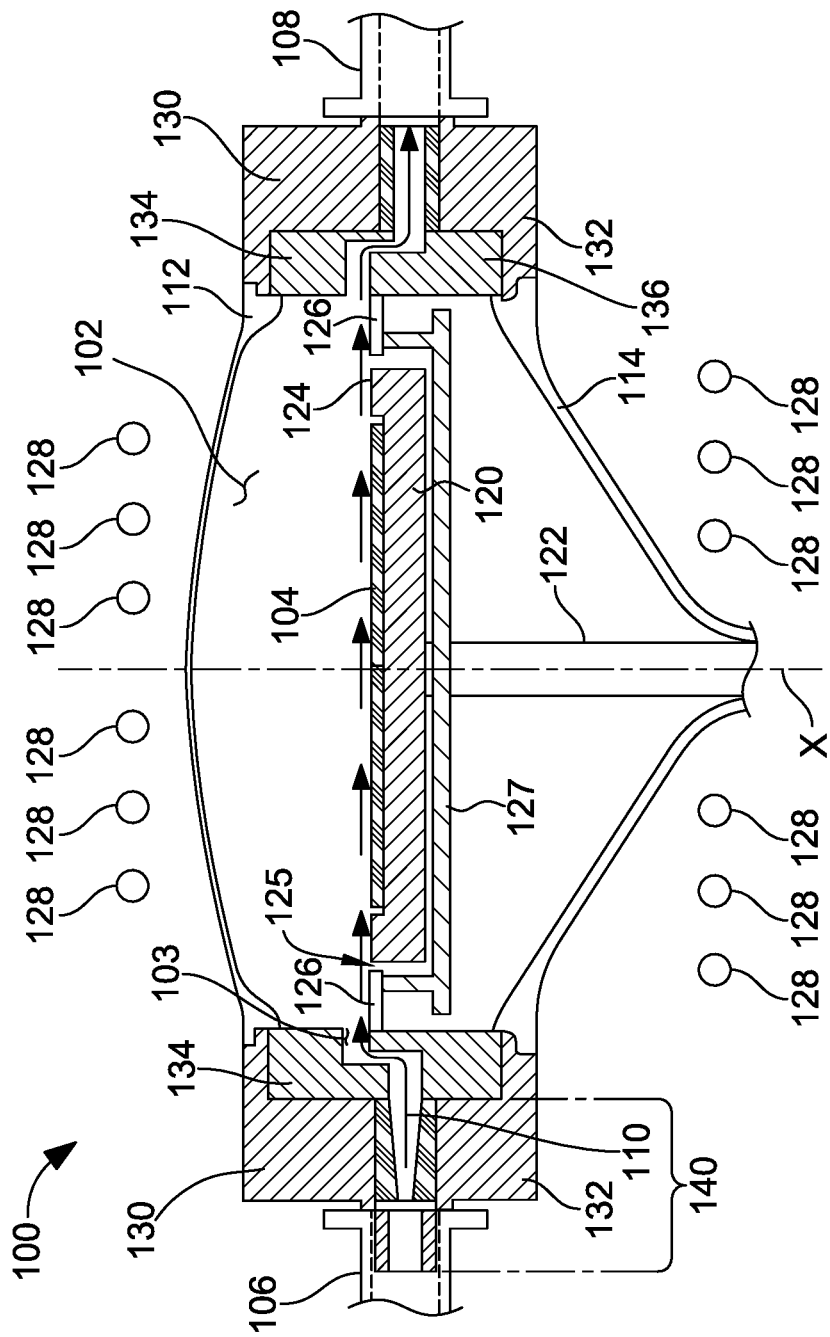
FIG. 3 is a cross-section view of the processing reactor having a semiconductor structure loaded therein.

The reactor 100 includes a susceptor 120 within the processing chamber 102 for supporting a semiconductor structure 104 (FIG. 3). The susceptor 120 is connected to a shaft 122 that is connected to a motor (not shown) of a rotation mechanism (not shown) for rotation of the shaft 122, susceptor 120 and semiconductor structure 104 about a vertical axis X of the reactor system 100. A preheat ring 126 surrounds the susceptor 120 to bring process gasses up to temperature before contacting the semiconductor structure 104. The outside edge 124 of the susceptor 120 and inside edge of a preheat ring 126 are separated by an annular gap 125 to allow rotation of the susceptor 120. The semiconductor structure 104 is rotated to evenly process the structure in the reactor 100. The reactor 100 also includes a preheat ring support 127 that supports the preheat ring 126 and facilitates moving portions of preheat ring 126.

Incoming gas 110 may be heated prior to contacting the semiconductor structure 104. Both the preheat ring 126 and the susceptor 120 are generally opaque to absorb radiant heating light produced by high intensity radiant heating lamps 128 that may be located above and below the processing chamber 102. Equipment other than high intensity lamps 128 may be used to provide heat to the processing chamber 102 such as, for example, resistance heaters and inductive heaters. Maintaining the preheat ring 126 and the susceptor 120 at a temperature above ambient allows the preheat ring 126 and the susceptor 120 to transfer heat to the incoming gas 110 as the gas 110 passes over the preheat ring 126 and the susceptor 120. The diameter of the semiconductor structure 104 (FIG. 3) may be less than the diameter of the susceptor 120 to allow the susceptor 120 to heat incoming gas 110 before it contacts the semiconductor structure 104. The preheat ring 126 and susceptor 120 may be constructed of, for example, silicon carbide or opaque graphite coated with silicon carbide.

The upper and lower windows 112, 114 each comprise a generally annular body made of a transparent material, such as quartz, to allow radiant heating light to pass into the processing chamber 102 and onto the preheat ring 126, the susceptor 120, and the semiconductor structure 104. The windows 112, 114 may be planar, or, as shown in FIG. 1, the windows 112, 114 may have a generally dome-shaped configuration. In other embodiments, one or both of the windows 112, 114 may have an inwardly concave configuration. The upper and lower windows 112, 114 are coupled to the upper and lower chamber walls 130, 132 of the processing chamber 102, respectively.

The upper and lower chamber walls 130, 132 define the outer perimeter of the processing chamber 102, and abut the gas injection port 106 and the gas discharge port 108.

The reactor 100 may include upper and lower liners 134, 136 disposed within the processing chamber to prevent reactions between the gas 110 and the chamber walls 130, 132 (which are typically fabricated from metallic materials, such as stainless steel). The liners 134, 136 may be fabricated from suitably non-reactive materials, such as quartz.

The reactor 100 is exemplary and generally any reactor which permits a semiconductor structure 104 to be processed (e.g., etched) according to the methods of the present disclosure may be used unless stated otherwise.

In accordance with methods of the present disclosure, the processing reactor 100 is conditioned prior to processing the semiconductor structure 104 by depositing an engineered polycrystalline silicon surface layer 135 (FIG. 4) or "film" on the preheat ring 126 and susceptor 120. In a first step $S_1$, any existing surface layer or coating is stripped from the preheat ring 126 and susceptor 120 (i.e., a "clean etch" is performed). A stripping etchant such as hydrogen chloride (HCl) may be introduced into the reactor 100 without a semiconductor structure being disposed on the susceptor 120 to strip any previous polycrystalline silicon surface layer from the susceptor 120 and preheat ring 126. In some embodiments, the stripping step $S_1$ may be eliminated (e.g., if the susceptor 120 and/or preheat ring 126 is not coated with a previously-deposited polycrystalline silicon surface layer).

In a second step $S_2$, a polycrystalline silicon surface layer 135 (FIG. 4) (which may also be referred to herein as a "polysilicon" layer or "coating") is deposited on the susceptor 120 and preheat ring 126. The polycrystalline silicon surface layer 135 may be deposited on the front surfaces of the susceptor 120 and preheat ring 126 by contacting the front surface with a silicon-containing gas that decomposes and forms the polycrystalline silicon layer (i.e., without a semiconductor structure being disposed on the susceptor 120). Example silicon-containing gases include methyl silane, silicon tetrahydride (silane), trisilane, disilane, pentasilane, neopentasilane, tetrasilane, dichlorosilane ($SiH_2Cl_2$), trichlorosilane ($SiHCl_3$), silicon tetrachloride ($SiCl_4$), among others. The silicon-containing gas may be mixed with a carrier gas such as hydrogen (e.g., trichlorosilane in hydrogen). The concentration of the gas may be determined based on the desired deposition effects (e.g., deposition rate).

The processing chamber 102 may be at any suitable pressure (e.g., atmospheric) during polysilicon deposition. The deposition time may vary depending on the deposition temperature, concentration and desired thickness. In some embodiments, the polysilicon layer is at least 0.25 µm thick or at least about 0.5 µm, at least 1 µm, at least 2.5 µm, or at least 4 µm thick (e.g., 0.25 µm to 10 µm, from 0.25 µm to about 5 µm or from about 1 µm to about 5 µm).

The polycrystalline silicon layer that is deposited may be engineered to enhance or promote certain properties of the polycrystalline silicon layer. For example, the polycrystalline silicon layer that is deposited may be engineered to increase the surface area of the polycrystalline silicon layer. In some embodiments, the polycrystalline silicon layer is deposited at a relatively low temperature to decrease the grain size of the deposited coating. For example, in embodiments in which trichlorosilane is used as the silicon-containing gas, polysilicon may be deposited at a temperature less than 1150° C. In some embodiments, the polycrystalline silicon surface layer 135 is deposited on the susceptor 120 at a temperature less than 1125° C., less than 1100° C., less than 1075° C., less than 1050° C., less than 1000° C. or less than 900° C., or from 800° C. to 1150° C., from 800° C. to 1100° C. or from 900° C. to 1050° C. Deposition temperatures for gases other than trichlorosilane may be selected based on known suitable temperatures (e.g., according to published methods).

Alternatively or in addition to controlling the temperature at which the polysilicon layer is deposited, the polysilicon surface layer 135 on the susceptor 120 and/or preheat ring 126 may be "grooved" to increase the surface area of the polysilicon layer 135 and produce the engineered surface layer. The susceptor 120 and/or preheat ring 126 may be grooved by introducing a grooving etchant into the processing chamber 102 of the processing reactor 100. Generally, the grooving etchant (which may also be referred to herein as a "first etchant") is introduced into the chamber 102 without a semiconductor structure being disposed on the susceptor 120. The grooving etchant acts to groove the polysilicon surface layer and produce a "surface-modified" polycrystalline silicon surface layer 135.

Any suitable grooving etchant may be used such as, for example, hydrogen, hydrogen chloride or a mixture of hydrogen and hydrogen chloride.

In some embodiments, the polysilicon coating 135 that is deposited on the susceptor is relatively thick such as at least 1.25 µm, at least 1.5 µm, at least 1.75 µm or at least 2 µm (e.g., from 1.25 µm to 5.0 µm, from 1.5 µm to 5 µm or from 1.75 µm to 5 µm). Such relatively thick polysilicon coatings may increase the surface area of the coating relative to thinner coatings.

Once the engineered polysilicon surface layer 135 (i.e., the polysilicon surface layer deposited at a relatively low temperature as described above and/or which is contacted with an etchant to prepare a surface-modified polycrystalline silicon surface layer and/or which is relatively thick) has been formed on the susceptor 120 and/or preheat ring 126, a semiconductor structure 104 (FIGS. 3 and 5) is loaded onto the susceptor 120 in third step $S_3$.

Once the semiconductor structure 104 is loaded onto the susceptor 120, in a fourth step $S_4$ the semiconductor structure is contacted with a smoothing etchant (also referred to herein as a "second etchant") to etch and/or smooth the semiconductor structure 104. The smoothing etchant may be selected from hydrogen, hydrogen chloride or a mixture of hydrogen and hydrogen chloride.

Figure 6:
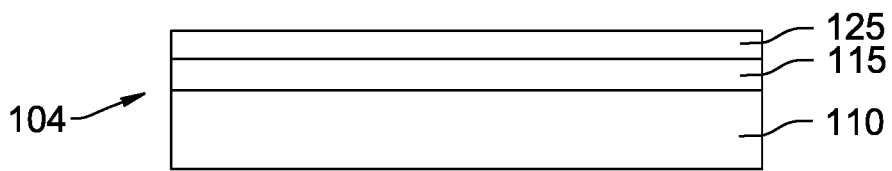
FIG. 6 is a cross-section view of a silicon-in-insulator structure.

Generally, the semiconductor structure 104 may be any structure in which it is desirable to etch the structure. Referring now to FIG. 6, in some embodiments the semiconductor structure is a silicon-on-insulator (SOI) structure 104. The silicon-on-insulator structure 104 includes a handle structure 110, a silicon top layer 125, and dielectric layer 115 disposed between the handle structure 110 and the silicon layer 125. The silicon-on-insulator structure 104 may be produced by any of methods known to those of skill in the art. In some embodiments, the semiconductor structure 104 has an amount of oxide on the edge of the semiconductor structure.

Once the semiconductor structure 104 (which may be referred to herein as a "first" semiconductor structure) is contacted with a smoothing etchant, additional structures may be processed according to embodiments of the present disclosure. The first semiconductor structure 104 is removed from the susceptor 120 after it has been etched (e.g., smoothed). The susceptor 120 is contacted with a stripping etchant (i.e., step $S_1$ above) to strip the surface-modified polycrystalline silicon surface layer 135 from the susceptor 120. A second polycrystalline silicon surface layer is deposited on the susceptor 120 and preheat ring 126 (step $S_2$). In some embodiments, the second polycrystalline silicon surface layer is deposited at a relatively low temperature to decrease the grain size of the deposited surface layer as described above (e.g., less than 1150° C., less than 1125° C., less than 1100° C., less than 1075° C., less than 1050° C., less than 1000° C. or less than 900° C.).

Alternatively or in addition to depositing the second polycrystalline silicon surface layer 135 at a relatively low temperature to decrease the grain size of the second polycrystalline silicon surface layer, in some embodiments, the second polycrystalline silicon surface layer is contacted with the first etchant (i.e., a separate gas having the same or close concentration to the first etchant described above) to produce a second surface-modified polycrystalline silicon surface layer. A second semiconductor structure (e.g., same type of structure as structure 104 described above) is loaded onto the susceptor 120 (e.g., which has a polycrystalline silicon surface layer deposited at the relatively lower temperatures described above and/or which is surface-modified as described above). The second semiconductor structure is contacted with the second etchant (i.e., a separate gas having the same or close concentration to the second etchant described above) to etch the second semiconductor structure.

Compared to conventional methods for etching a semiconductor structure, the methods of the present disclosure have several advantages. In embodiments in which the temperature at which the polycrystalline silicon surface layer is deposited on the susceptor is relatively low (e.g., less than 1150° C., less than 1125° C., less than 1100° C., less than 1075° C., less than 1050° C., less than 1000° C. or less than 900° C.), the grain size of the polycrystalline silicon may be reduced which increases the surface area of the surface layer. In embodiments in which the polycrystalline surface layer is surface-modified such as by contacting the polycrystalline surface layer with a grooving etchant, the surface area of the polycrystalline silicon surface layer is increased which reduces edge effects and increases uniformity in the etched semiconductor structure. In embodiments in which a relatively thick polycrystalline silicon surface layer is deposited on the susceptor (e.g., at least 1.25 µm, at least 1.5 µm, at least 1.75 µm or at least 2 µm), the polycrystalline silicon surface layer may be characterized by increased surface area.

Without being bound by any particular theory, it is believed that the increase in surface area increases the etch rate of the polysilicon surface layer relative to the semiconductor structure. This depletes the etching gas at the gap between the susceptor and the semiconductor structure similar to depletion of the gas on the semiconductor structure surface which reduces the edge roll-off at the edge of the semiconductor and increases thickness uniformity. The etchant concentration at the edge of the semiconductor structure becomes less dependent on the size of the gap between the susceptor and the semiconductor structure and the influence of wafer centering on the susceptor is reduced.

EXAMPLES

The processes of the present disclosure are further illustrated by the following Examples. These Examples should not be viewed in a limiting sense.

Figure 7:
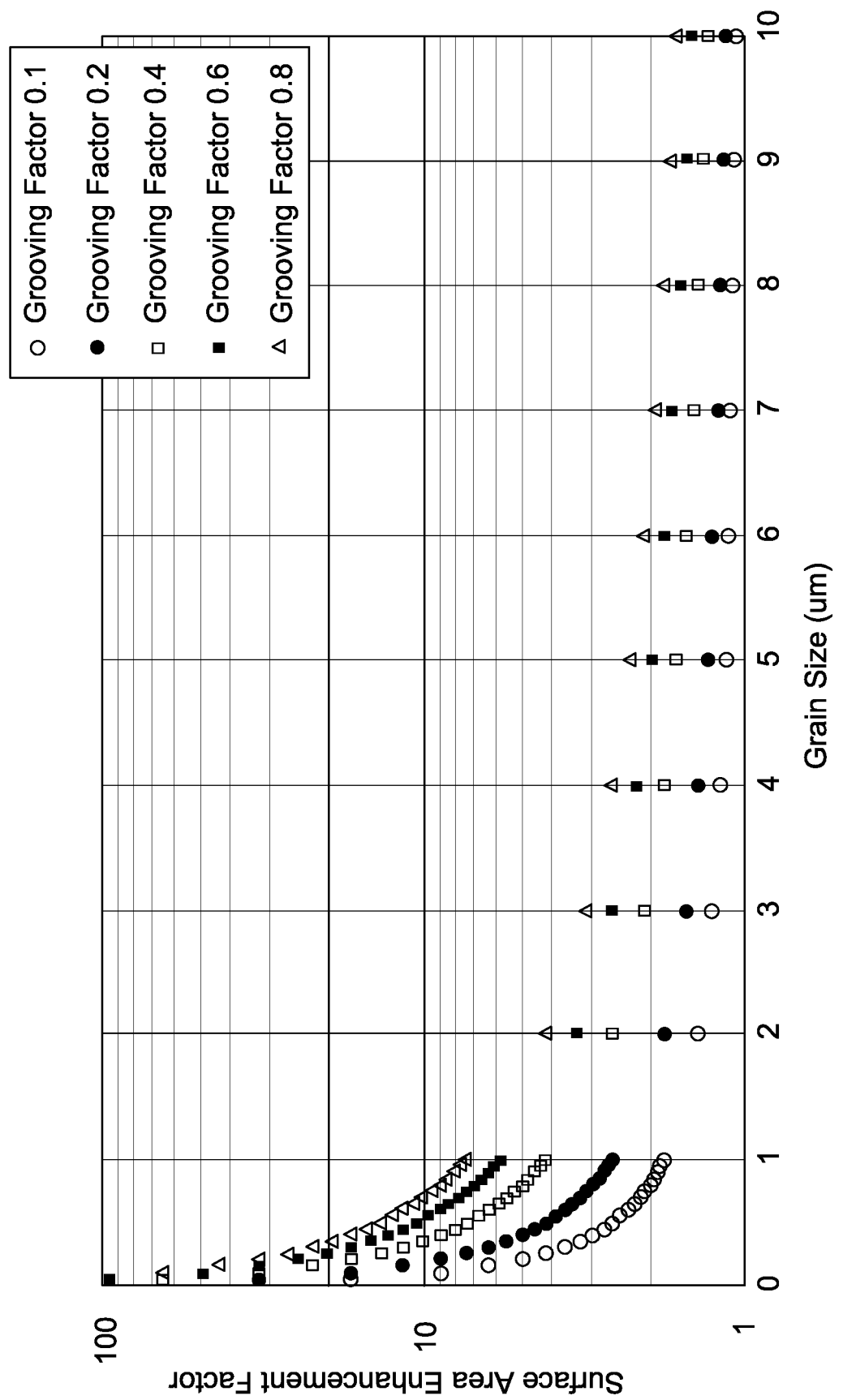
FIG. 7 is a graph of the effects of grain size and grooving factor on the surface area of a polycrystalline silicon surface layer.

Example 1: Surface Area Increase as a Function of Grain Size and Grooving Factor FIG. 7 shows the surface area increase as a function of grain size and grooving factor for a 2 μm polycrystalline silicon layer. As can be seen from FIG. 7, reducing grain size and increasing grooving factor drive the surface area increase up to 2 orders or magnitude.

Example 2: Edge Roll-Off Effect of Use of Polycrystalline Silicon Susceptor Coatings Engineered by Reduced Temperature Deposition and/or Grooving Several polycrystalline silicon engineered coatings were formed on a susceptor and the edge thickness effect was evaluated. Deposition temperature was used to control the grain size as shown in Table 1. Grooving in $H_2$ and $H_2$+HCl mixture were employed to further increase the total exposed surface area.

The semiconductor structures were 300 mm SOI wafers. Edge thickness roll-off from the 147 mm radial position to the wafer edge was evaluated. The azimuthal thickness range at the 147 mm radial position was also evaluated (i.e., the thickness variation across wafer rotation angles at 147 mm).

Figure 8:
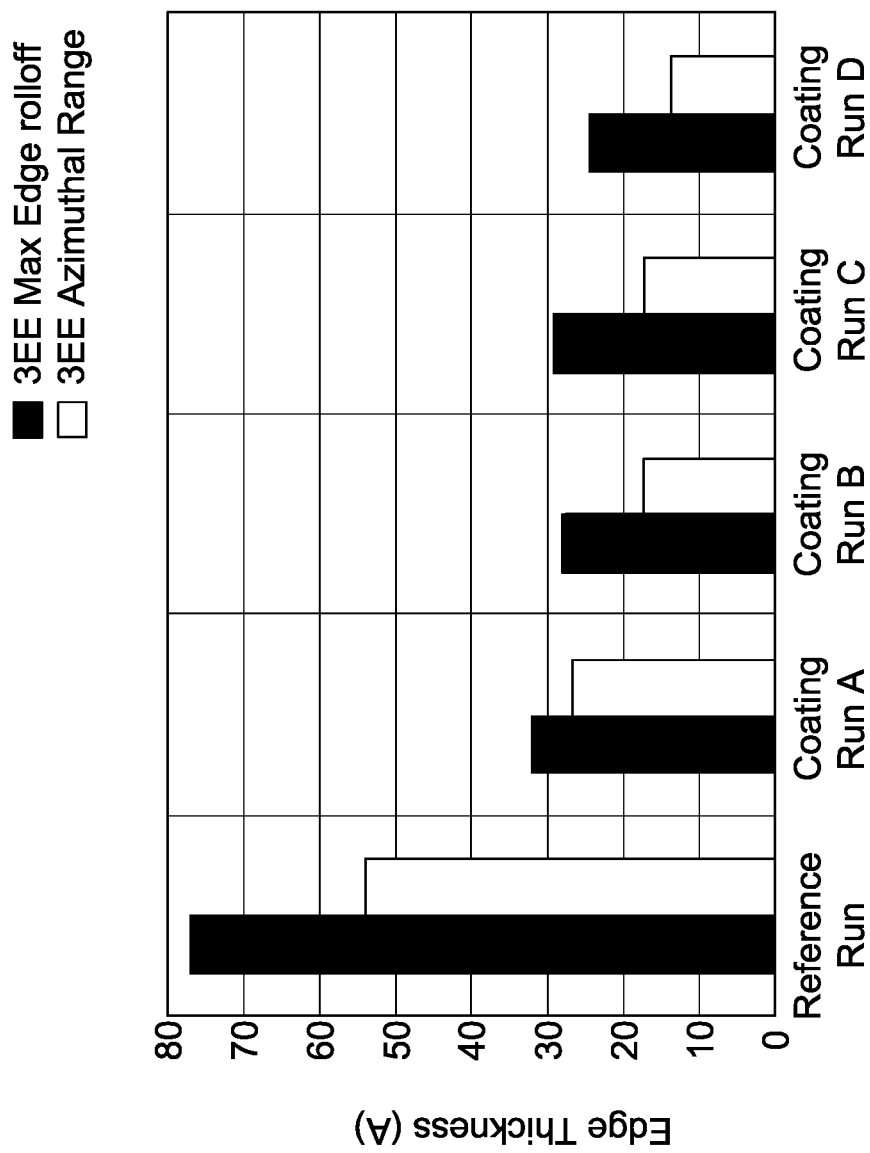
FIG. 8 is a bar graph showing the edge thickness in SOI structures processed according to Example 2.

As shown in FIG. 8, the difference between the reference coating process (with temperature ramping down from 1150° C. to 1000° C. and a thickness of 1 μm) and the other runs shows increasing the thickness of the polycrystalline silicon coating layer from 1 to 2 μm reduces the edge thickness range by more than 50%. Without being bound by any particular theory, it is believed that the increase in uniformity may be attributed to the increased surface area from roughness. As layer thickness increases, the surface roughness increases and total surface area increases. Grooving the polycrystalline silicon coating (Run B and Run C) by contacting the coating with an etchant also reduced edge roll-off and increased uniformity resulting in an additional improvement in the thickness range by 10 Å. In Run D, lowering the coating temperature from 1150° C. to 1000° C. reduced the grain size by about 2-3 times and further improved the thickness range by additional 5 Å.

TABLE 1

Polycrystalline Silicon Coating Conditions

| Coating | Temperature | Thickness (μm) | Grooving time (s) |
|---|---|---|---|
| Reference Run | 1150-->1000 dynamic | 1 | 0 |
| Coating Run A | 1150° C. | 2 | 0 |
| Coating Run B | 1150° C. | 2 | 30 (in $H_2$) |
| Coating Run C | 1150° C. | 2 | 30 (in $H_2$ + HCl) |
| Coating Run D | 1000° C. | 2 | 0 |

As used herein, the terms "about," "substantially," "essentially" and "approximately" when used in conjunction with ranges of dimensions, concentrations, temperatures or other physical or chemical properties or characteristics is meant to cover variations that may exist in the upper and/or lower limits of the ranges of the properties or characteristics, including, for example, variations resulting from rounding, measurement methodology or other statistical variation.

When introducing elements of the present disclosure or the embodiment(s) thereof, the articles "a," "an," "the," and "said" are intended to mean that there are one or more of the elements. The terms "comprising," "including," "containing," and "having" are intended to be inclusive and mean that there may be additional elements other than the listed elements. The use of terms indicating a particular orientation (e.g., "top," "bottom," "side," etc.) is for convenience of description and does not require any particular orientation of the item described.

As various changes could be made in the above constructions and methods without departing from the scope of the disclosure, it is intended that all matter contained in the above description and shown in the accompanying drawing[s] shall be interpreted as illustrative and not in a limiting sense.

What is claimed is:

1. A method for etching a semiconductor structure in a processing reactor comprising a susceptor which supports the semiconductor structure, the method comprising:
   depositing a polycrystalline silicon surface layer on the susceptor;
   contacting the polycrystalline silicon surface layer with a first etchant to produce a surface-modified polycrystalline silicon surface layer;
   loading a semiconductor structure onto the susceptor having the surface-modified polycrystalline silicon surface layer disposed thereon; and
   contacting the semiconductor structure with a second etchant to etch the semiconductor structure.

2. The method as set forth in claim 1 wherein the first etchant is hydrogen, hydrogen chloride or a mixture of hydrogen and hydrogen chloride.

3. The method as set forth in claim 1 wherein the polycrystalline silicon surface layer is deposited on the susceptor at a temperature less than 1150° C.

4. The method as set forth in claim 3 wherein the polycrystalline silicon surface layer is deposited by introducing trichlorosilane into the processing reactor.

5. The method as set forth in claim 1 wherein the polycrystalline silicon surface layer is deposited on the susceptor at a temperature less than 1100° C.

6. The method as set forth in claim 1 wherein the processing reactor comprises a preheat ring having an opening in which the susceptor is disposed, the method further comprising:
   depositing a polycrystalline silicon surface layer on the preheat ring; and
   contacting the polycrystalline silicon surface layer disposed on the preheat ring with the first etchant to produce a surface-modified polycrystalline silicon surface layer.

7. The method as set forth in claim 1 wherein the susceptor is made of silicon carbide or silicon-carbide coated graphite.

8. The method as set forth in claim 1 wherein, prior to depositing the polycrystalline silicon surface layer on the susceptor, the susceptor is contacted with a stripping etchant to strip a previously deposited polycrystalline silicon surface layer from the susceptor.

9. The method as set forth in claim 1 wherein the semiconductor structure is a silicon-on-insulator structure having a handle structure, a silicon top layer and a dielectric layer disposed between the handle structure and the silicon top layer.

10. The method as set forth in claim 1 wherein the second etchant is hydrogen, hydrogen chloride or a mixture of hydrogen and hydrogen chloride.

11. The method as set forth in claim 1 wherein the polycrystalline silicon surface layer has a thickness of at least 1.25 µm.

12. The method as set forth in claim 1 wherein the semiconductor structure is a first semiconductor structure, the method further comprising:
   removing the first semiconductor structure from the susceptor after the first semiconductor structure has been etched;
   contacting the susceptor with a stripping etchant to strip the surface-modified polycrystalline silicon surface layer from the susceptor;
   depositing a second polycrystalline silicon surface layer on the susceptor;
   contacting the second polycrystalline silicon surface layer with the first etchant to produce a second surface-modified polycrystalline silicon surface layer;
   loading a second semiconductor structure onto the susceptor having the second surface-modified polycrystalline silicon surface layer disposed thereon; and
   contacting the second semiconductor structure with the second etchant to etch the second semiconductor structure.

\* \* \* \* \*